United States Patent [19]

Levinstein et al.

[11] 4,276,557
[45] Jun. 30, 1981

[54] INTEGRATED SEMICONDUCTOR CIRCUIT STRUCTURE AND METHOD FOR MAKING IT

[75] Inventors: Hyman J. Levinstein, Berkeley Heights; Shyam P. Murarka; Ashok K. Sinha, both of New Providence, all of N.J.

[73] Assignee: Bell Telephone Laboratories, Incorporated, Murray Hill, N.J.

[21] Appl. No.: 974,378

[22] Filed: Dec. 29, 1978

[51] Int. Cl.³ ............................................ H01L 23/48
[52] U.S. Cl. ...................................... 357/67; 357/23; 357/59; 357/71
[58] Field of Search ...................... 357/67, 23, 59, 71

[56] References Cited

U.S. PATENT DOCUMENTS 4,128,670  12/1978  Gaensslen .............................. 357/67
4,180,596  12/1979  Crowder et al. ...................... 357/23

OTHER PUBLICATIONS

Electrochemical Soc. Inc., 1969, p. 166.
App. Physics Letters, vol. 33, No. 1, Nov. 1, 1978, pp. 826–827.

Primary Examiner—Edward J. Wojciechowicz
Attorney, Agent, or Firm—Herbert M. Shapiro

[57] ABSTRACT

The compounds $TiSi_2$ and $TaSi_2$ have been found to be suitable substitutes for polysilicon layers in semiconductor integrated circuits. Suitable conducting properties of the compounds are ensured by providing a relatively thin substrate of polysilicon.

7 Claims, 4 Drawing Figures

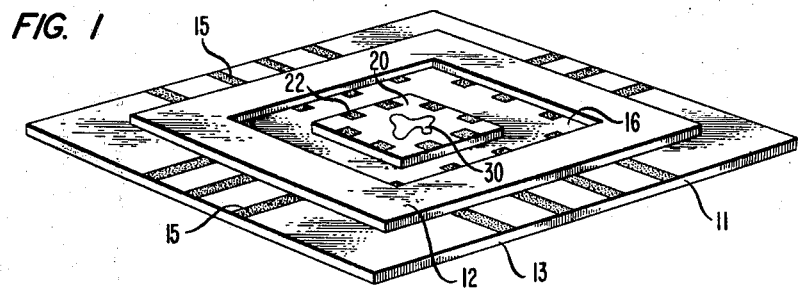
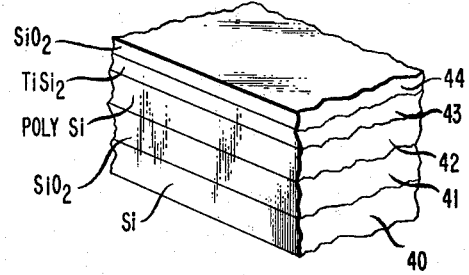
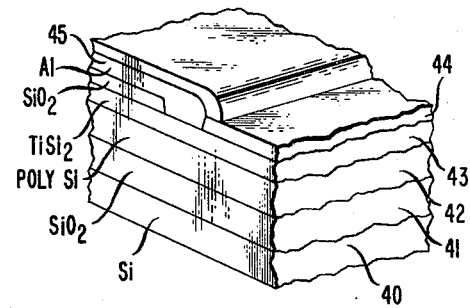
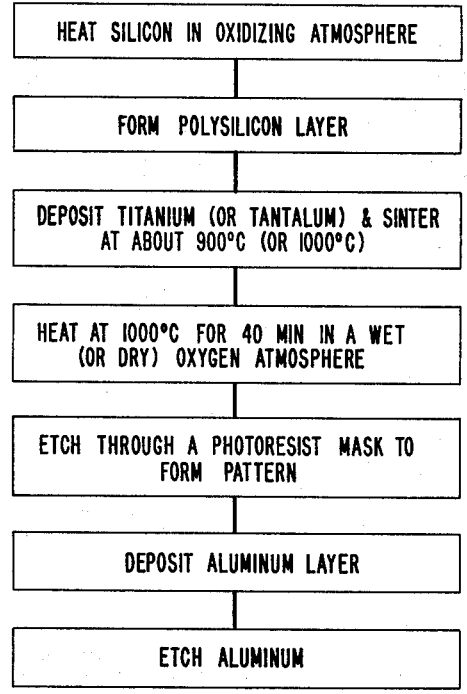

INTEGRATED SEMICONDUCTOR CIRCUIT STRUCTURE AND METHOD FOR MAKING IT

FIELD OF THE INVENTION

This invention relates to semiconductor integrated circuits.

BACKGROUND OF THE INVENTION

Semiconductor integrated circuits, as well as the design, manufacture, and operation of such circuits, are well known in the art. Common to such circuits is an epitaxially grown single crystal film in which various regions of different conductivity type are interconnected by multiple layers of patterned electrically conducting material.

A variety of electrically conducting material is available for implementing the layers. Gold, copper, aluminum, polysilicon, and various metal alloys, for example, are all suitable to some extent. On the other hand, each has its drawbacks as is well known in the art.

In the large scale integration (LSI)-MOS-FET technology, polysilicon has become the standard material for the conducting layer closest to the epitaxial film. Typically, the polysilicon layer is a first layer separated from a second electrically conducting overlay by an insulating layer typically of silicon dioxide. But polysilicon exhibits relatively high resistivity and the lengths of polysilicon paths is limited as a consequence. For example, various functional areas in an integrated circuit chip cannot be interconnected together directly by polysilicon. Rather, the connection from each area are brought out to aluminum bus bars formed from the second overlay. Similarly, LSI high speed circuits require high conductivity input-output lines. The requirement results in the exclusion of polysilicon as a material for such use. Aluminum power lines are needed and this often requires aluminum bonding pads within the chip. The additional aluminum areas are, essentially, wasted space and parallel aluminum conductors create yield problems.

A relatively high conductivity material leading to the elimination of aluminum from use in the above-mentioned applications in integrated circuits would lead to, for example, a semiconductor memory cell size reduction of from 30 to 50%.

BRIEF DESCRIPTION OF THE INVENTION

The solution to the foregoing problem is based on the recognition that $TiSi_2$ and $TaSi_2$ uniquely retain high conductivity properties when used with a relatively thin layer of polysilicon. The use of these materials is considered particularly contrary to prior art thinking which indicated that these and like materials cannot be oxidized properly to form a suitable deposition surface for an electrically conducting overlay. If polysilicon is absent, an oxide of titanium may be formed which cannot be etched. Consequently, no connections can be made between an electrically conducting overlay and ones of the conductivity type regions in the epitaxial film therewith. A sintering process is used herein where, for example, $TiSi_2$ is formed in situ at about 900 degrees C. or less in a hydrogen atmosphere on a thin layer of polysilicon. The presence of a layer of polysilicon to which titanium is sintered allows a later oxidation to $SiO_2$ to occur so long as excess polysilicon is present.

The invention thus comprises a semiconductor integrated circuit including a single crystal semiconductor layer coated by an $SiO_2$ layer and including a lamelate overlay comprising first and second electrically conducting layers separated by an electrically insulating layer. The structure is characterized in that the overlay comprises a substrate of a polysilicon layer and a layer of a material taken from a class consisting of $TiSi_2$ and $TASi_2$.

BRIEF DESCRIPTION OF THE DRAWING

FIG. 1 is a projection view of a semiconductor integrated circuit chip.

FIGS. 2 and 3 are cross-section views of portions of the chip shown packaged in FIG. 1; and FIG. 4 is a block diagram of a process for making the chips of FIG. 1.

DETAILED DESCRIPTION

FIG. 1 shows a projection view of a semiconductor chip assembly. The assembly includes a substrate 11. The substrate comprises layers 12 and 13 sandwiching a sunburst pattern 15 of electrical conductors therebetween. Layer 12 includes a centrally disposed square aperture 16 which exposes the inner ends of the conductors of the sunburst pattern.

A semiconductor integrated circuit chip 20 is mounted on the portion of layer 13 exposed by the aperture 16. Typically chip 20 includes electrical lands 22 at its periphery for external connection to the exposed inner ends of the electrical conductors of the sunburst.

An integrated circuit chip has multiple functional areas defined therein. These areas are interconnected with one another and to lands 22 by conductors defined by patterned layers of electrically conducting material formed on the surfaces of chip 20. These layers are electrically insulated from one another and from the epitaxial layer of the chip typically by silicon dioxide layers. Of course, contact between portions of the conducting layers and various regions of opposite conductivity in the epitaxial layer require through connections. The term "through connection" herein refers to an electrically conducting path from one layer of conducting material through other layers separating it from the epitaxial layer. When through connections are made, electrical continuity is achieved between the area of the chip and the externally exposed ends of the conductors of the sunburst pattern. The design permits external connection even with an enclosure (not shown) over opening 16 secured in place.

Freeform area 30 of FIG. 1 is a representative area of chip 20 and it is to this area that we now turn our attention. FIGS. 2 and 3 show area 30 partially in cross section to expose the plurality of layers from which the chip is constituted. The bottom layer 40 as shown, illustratively, comprises silicon on which an electrically insulating layer of silicon dioxide is formed typically by growing the layer by heating in an oxidizing atmosphere. This step is represented by the top block in FIG. 4. Layer 40 conveniently comprises an epitaxially grown layer 10–20 microns thick and the oxide layer has a thickness of 500–9000 Angstroms. The insulating layer is designated 41 in FIG. 1.

The next layer 42 comprises polysilicon formed by chemical vapor deposition (CVD) and has a thickness of about 5000 Angstroms. A layer of titanium of about 1000 Angstroms is deposited on the polysilicon and is then sintered at a temperature of about 900 degrees C. as indicated by the next block in FIG. 4. This step forms approximately 2500 Angstroms of titanium silicide (TiSi$_2$) which is represented at 43 in each of FIGS. 2 and 3.

The titanium silicide layer next is heated in an oxygen atmosphere at 1000 degrees C. for 40 minutes to form an SiO$_2$ layer 44 as indicated by the fourth block from the top in FIG. 4.

The next step is to etch a pattern in SiO$_2$ layer as indicated by the fifth block in FIG. 4. Etching is carried out through a mask by exposure to, for example, a glow-discharge plasma containing C$_2$F$_6$ (55%) and CHF$_3$ (45%) now a commonly used etchant for SiO$_2$ to form apertures in the layer as represented at 45 in FIG. 3. As indicated in the last two blocks of FIG. 4 a layer of aluminum 0.5% Cu, 2% Si alloy, 1$\mu$ thick is deposited by sputter gun deposition and etched, for example, in a plasma of CCl$_4$, Bcl$_3$ and He. The structure of FIG. 3 cannot be realized by prior art techniques in which TiSi$_2$ is formed in the absence of a layer of polysilicon therebeneath. It is characteristic of these materials that, in the absence of polysilicon, they form impenetrable poorly insulating, and undesirable oxide overlays which preclude realization of the structure of FIG. 3. Further, oxidation of the materials in the absence of an underlying polysilicon layer results in a loss of the desirable high conductivity properties.

One purpose of the polysilicon layer is to provide the silicon source for the reaction of Ti to TiSi$_2$. Another purpose is as a source of silicon for subsequent oxidation of the composite TiSi$_2$ and polysilicon to form SiO$_2$. To this end, it is necessary therefore to retain the high conductivity through subsequent device processing steps which involve exposure to oxidizing ambients and high temperature to ensure the presence of "excess" polysilicon where "excess" is defined as a layer greater than 1000 Angstroms. A layer of less than 1000 Angstroms results in undesirable defects in the polysilicon. For a 1000 Angstroms layer of titanium a TiSi$_2$ layer of over 2000 Angstroms is formed with 1 ohm/square resistivity. The TiSi$_2$ layer has a thickness of less than 5000 Angstroms to avoid stress cracking.

Embodiments employing TaSi$_2$ instead of TiSi$_2$ are similar in that TaSi$_2$ is formed by sintering at 900 or 1000 degrees C. or above in H$_2$ or A$_r$. But the attainable resistivity decreases as the temperature of formation increases above 900 degrees C. Moreover, oxidation is carried out in steam rather than in dry oxygen as is the case with TiSi$_2$. TaSi$_2$ on polysilicon does not oxidize in dry ambient at temperature up to 1100 degrees C. These differences related to the use of TaSi$_2$ are shown in the appropriate blocks of FIG. 4.

Other related silicates such as molybdenum and Tungsten silicides cannot be used because they form MoO$_3$ and WO$_3$ which are volatile at high temperatures commonly used for processing integrated circuits.

The following is a specific example of an IGFET fabricated with the above-described TaSi$_2$ system.

The starting material is a substrate of single crystal Si, having a (100) orientation and doped with boron to a resistivity of 7 ohm cm. The Si-substrate is thermally oxidized at 1000 degrees C. for 30 minutes in a dry oxygen ambient to grow an oxide, 350 Angstroms thick. Over this oxide, a thin film of Si$_3$N$_4$ is deposited by chemical vapor deposition from a mixture of silane and ammonia at 680 degrees C. A layer of photoresist is defined into a pattern using standard photolithographic techniques so as to leave the resist over active device areas of the wafer. The Si$_3$N$_4$ is etched from the nonactive "field" areas thus defined, using an rf-glow discharge in a mixture of CF$_4$ and O$_2$. The etched areas are implanted with boron ions accelerated to a voltage of 30 kV and up to a total dose of $1.5 \times 10^{13}$ ions/cm$^2$. This step leads to the formation of a heavily p-doped channel stop with a high threshold voltage in the nonactive field areas. The resist is then stripped in an oxygen plasma and the exposed areas of thin oxide in the field region are etched in a solution of buffered HF down to bare Si. With the active areas masked by the Si$_3$N$_4$ film, the wafer is subjected to a mixture of 10 percent O$_2$+90 percent N$_2$ at 1100 degrees C. for 20 minutes to drive in the implanted B ions and then to a steam ambient at 1000 degrees C. for 430 minutes to form a field oxide, 10,000 Angstroms thick. The masked areas are cleaned by successively etching in buffered HF, hot H$_3$PO$_4$ (180 degrees C.) and buffered HF down to Si in the active gate area. A thickness of 550 Angstroms of gate oxide is then grown at 1000 degrees C. in a mixture of O$_2$+3% HCl for 42 min. The oxide is annealed, insitu, for $\frac{1}{2}$ hour in Ar also at 1000 degrees C. to provide optimum electrical characteristics of the Si/Si-O$_2$ interface. In order to adjust the threshold voltage of the MOSFETs, the Si in the gate areas is implanted with B at 3 keV to a dose of $5 \times 10^{11}$ cm$^{-2}$.

A layer of poly-Si, 5000 Angstroms thick is deposited by low pressure CVD from SiH$_4$ at 650 degrees C., after which the poly-Si is diffused with phosphorus at 1000 degrees C. for 60 min. using PBr$_3$ as the diffusion source. During this step, a thin layer of SiO$_2$ containing phosphorus forms over the poly-Si; this oxide is removed by etching in a mixture of 50 parts H$_2$O and 1 part HF for 10 min. A thin film of Ta, 1000 Angstroms thick, is deposited over the poly-Si using a magnetron sputter source. The film is then annealed at 1000 degrees C. for 30 min. in pure Ar or H$_2$ to form approximately 2500 Angstroms of TaSi$_2$. About 2000 Angstroms of poly-Si is consumed and 3000 Angstroms of poly-Si remains underneath the TaSi$_2$. The sheet resistance of this composite structure is less than 2 ohms per sq. It is important that the annealing ambient be free of oxygen or moisture; otherwise an oxide of Ta is formed and the sintering reaction does not go to completion.

A desired pattern of a masking layer consisting of photoresist is formed over the TaSi$_2$ by using standard lithographic techniques. The TaSi$_2$ and poly-Si layers are next etched in a plasma of CF$_4$+8%O$_2$ at a pressure of 150 millitorr, and at a power of 200 watts. In this mixture, the etch-rate of the TaSi$_2$ layer is about 500 Angstroms/min and that of the poly-Si layer is approximately 1000 Angstroms/min. The etching, the photoresist is removed and then the wafer is cleaned.

Source and drain areas of the MOSFET are formed by Ion-implanting Arsenic at 30 kV and a dose of $7 \times 10^{15}$ cm$^{-2}$ through the thin oxide layers. The previously defined areas of TaSi$_2$/poly-Si and thick oxide in the field region act as a mask against Arsenic implantation. A thin layer of oxide is grown over the silicide areas in steam at 1000 degrees C for 10 min. The top of the wafer is coated with photoresist and various layers are etched off the back of the wafer in the following sequence: SiO$_2$ (buffered HF, 2 min.), poly-Si (1% Cr O$_3$ in 25:1 H$_2$O:HF 5 min.) and SiO$_2$ (buffered HF, 10 min).

A layer of 1$\mu$ thick phosphorus doped SiO$_2$ (7%P-glass) is deposited using a reaction of SiH$_4$, O$_2$ and PH$_3$ at 480 degrees C. This oxide is flowed at 1100 degrees C. for 15 min. in nitrogen to achieve a smooth topology. Windows (apertures) are opened in the P-glass down to diffused Si in the source and drain areas and to the $TaSi_2$ gate. The wafers are gettered at 1000 degrees C. in $PB_3$ for 30 min. This step helps remove unwanted heavy metal impurities from the active surface regions of the wafer to the back of the wafer. The windows are cleaned in 30:1 $H_2O$:BHF for 1 to 3 min., after which the wafers are annealed at 700 degrees C. in $H_2$ for 30 min. to reduce the slow-trapping instability in the gate oxide.

A top metallization layer consisting of Al 0.5%Cu, 0.7$\mu$ thick, is deposited using the sputter gun. The metal is defined using photolithography and standard chemical etching to form contacts, interconnections, and bonding pads. The top of the wafer is coated with photoresist, and then the phosphorus-doped Si-layer, which formed in the back of the wafer during gettering, is removed by plasma etching in a mixture of $CF_4 + 8\%O_2$ at 50 watts for 20 min., following which the resist is stripped in an $O_2$ plasma at 100 watts for 10 min. The wafers are annealed in $H_2$ at 450 degrees C. for $\frac{1}{2}$ hour to assure ohmic contacts and to anneal out surface states in the gate oxide. A final passivation layer of 1$\mu$ thick Si-N is deposited by plasma enhanced chemical vapor deposition from a mixture of $SiH_4$, $NH_3$ and Ar at 330 degrees C. Bonding pad areas are opened up by etching Si-N in a $CF_4/O_2$ plasma.

The back of the wafer is cleaned and a film of Ti followed by Au is deposited by sequential evaporation. The devices are tested, separated into chips and packaged by bonding the back of the chip to a metallized mini ceramic with a Au, Si eutectic alloy, and by bonding Au-wires to the Al bonding pads and to metallized interconnections on the package leading to dual-in-line pins. The hermetic packaging is completed by soldering a top cover plate (not shown in the Figures in a dry $N_2$ ambient. For device fabrication, the polysilicon layer is doped N or P depending on the desired threshold voltage of the gate to be formed. Undoped polysilicon cannot be so used because it adds effectively to the thickness (capacitance) of the gate oxide due to its high resistivity.

We claim:

1. A semiconductor arrangement comprising a semiconductor chip including a single crystal semiconductor layer, a first electrically-insulating $SiO_2$ layer overlying said semiconductor layer, a layer of doped polysilicon having a thickness greater than 2000 Angstrom units overlying said first $SiO_2$ layer, a first layer of electrically-conducting material overlying said polysilicon layer, said electrically-conducting material being taken from a class consisting of $TiSi_2$ and $TaSi_2$ and an unpatterned second layer of $SiO_2$ overlying said first electrically-conducting layer.

2. An arrangement in accordance with claim 1 wherein said semiconductor layer comprises an epitaxially grown layer of silicon.

3. An arrangement in accordance with claim 2 wherein said chip also comprises a second layer of electrically-conducting material overlying said patterned second layer of $SiO_2$ and forming through connections to said first layer of electrically-conducting material.

4. An arrangement in accordance with claim 3 wherein said second layer of electrically-conducting material comprises aluminum.

5. An arrangement in accordance with claim 2 wherein said polysilicon layer has a thickness in excess of 1000 Angstroms.

6. An arrangement in accordance with claim 4 wherein said first layer of electrically-conducting material has a thickness of between about 2000 Angstroms and 5000 Angstroms.

7. A semiconductor device in accordance with claim 6 wherein said insulating layers comprise $SiO_2$.

* * * * *